(12) United States Patent
Wasson et al.

(10) Patent No.: US 6,939,650 B2
(45) Date of Patent: Sep. 6, 2005

(54) METHOD OF PATTERNING PHOTORESIST ON A WAFER USING A TRANSMISSION MASK WITH A CARBON LAYER

(75) Inventors: James R. Wasson, Tempe, AZ (US); Pawitter Mangat, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 201 days.

(21) Appl. No.: 10/346,623

(22) Filed: Jan. 17, 2003

(65) Prior Publication Data

US 2004/0142249 A1 Jul. 22, 2004

(51) Int. Cl.$^7$ .............................. G03F 9/00; G03C 5/00
(52) U.S. Cl. .......................... 430/5; 430/322; 430/323; 430/324
(58) Field of Search ........................... 430/5, 322, 323, 430/324

(56) References Cited

U.S. PATENT DOCUMENTS

| | | |
|---|---|---|
| 5,035,787 A | 7/1991 | Parker |
| 5,405,721 A | 4/1995 | Pierrat |
| 6,346,352 B1 | 2/2002 | Hayden |
| 6,479,195 B1 * | 11/2002 | Kirchauer et al. .............. 430/5 |
| 6,596,465 B1 * | 7/2003 | Mangat et al. ................. 430/5 |
| 2003/0190532 A1 * | 10/2003 | Yan ............................... 430/5 |

OTHER PUBLICATIONS

Wasson, J.R. et al., "Writing, repairing, and inspecting of extreme ultraviolet lithography reticles considering the impact of the materials," J. Vac. Sci. Technol. B 19(6), Nov./Dec. 2001, American Vacuum Society, pp. 2635–2640.

* cited by examiner

*Primary Examiner*—Geraldine Letscher
(74) *Attorney, Agent, or Firm*—James L. Clingan, Jr.; David G. Dolezal

(57) ABSTRACT

A photoresist layer on a semiconductor wafer is patterned using a mask with an absorbing layer that has been repaired by using an additional light-absorbing carbon layer that collects ions that are used in the repair process. After the repair has been completed, the ions that are present in the carbon layer are removed by removing the portion of the carbon layer that is not covered by the absorbing layer. Thus, the absorbing layer, which contains the pattern that is to be exposed on the photoresist layer, also acts as a mask in the removal of the portion of the carbon layer that contains the ions. Thereby the ions that are opaque at the particular wavelength being used are removed from the areas where light is intended to pass through the mask to the photoresist. The buffer layer is made absorbing to avoid problems with reflections at interfaces thereof.

29 Claims, 2 Drawing Sheets

METHOD OF PATTERNING PHOTORESIST ON A WAFER USING A TRANSMISSION MASK WITH A CARBON LAYER

FIELD OF THE INVENTION

This invention relates to making integrated circuits using transmission masks, and more particularly, to making integrated circuits using transmission masks that can be repaired.

RELATED ART

Transmission masks continue to be an essential part of the process of making integrated circuits, and as dimensions continue to decrease, these masks continue to become more critical to the process and also more difficult to make, especially to make defect free. In order to achieve the requirement of being defect free for a semiconductor manufacturing process, a transmission mask is often repaired using focused ion beam (FIB) equipment, which is commercially available. This technique is very precise but may cause unwanted side effects, especially as the frequency of the illumination source has lower and lower wavelengths. Thus, what are invisible defects at higher wavelengths may become opaque at lower wavelengths that are becoming more important as dimensions continue to shrink.

Thus, there is a need for improved repairing of transmission masks for lower wavelengths of illumination light used in the process of making integrated circuits.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one embodiment a photoresist layer on a semiconductor wafer is patterned using a mask with an absorbing layer that has been repaired by using an additional light-absorbing carbon layer that collects ions that are used in the repair process. After the repair has been completed, the ions that are present in the carbon layer are removed by removing the portion of the carbon layer that is not covered by the absorbing layer. Thus, the absorbing layer, which contains the pattern that is to be exposed on the photoresist layer also acts as a mask in the removal of the portion of the carbon layer that contains the ions. This is better understood by reference to the drawings and the following description.

Figure 1:
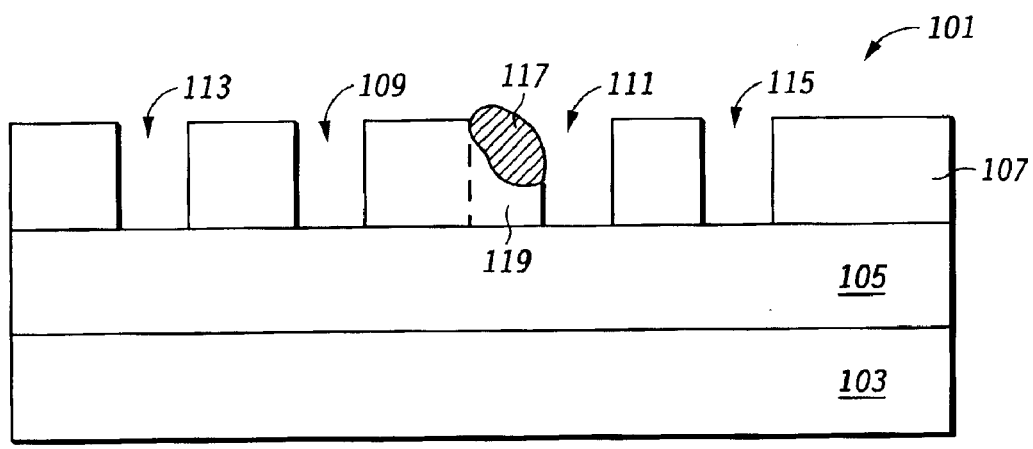
FIG. 1 is a cross section of a mask at a stage in processing.

Shown in FIG. 1 is a mask 101 comprising a transparent substrate 103, a buffer layer 105, and a patterned absorbing layer 107. In patterned absorbing layer 107 are spaces 109, 111, 113, and 115, a defect 117, and an unwanted portion 119. In one embodiment transparent substrate 103 is silicon oxide, buffer layer 105 is amorphous carbon, and absorbing layer 107 is chromium with a chrome oxide/nitride coating on the surface opposite buffer layer 105. The amorphous carbon for buffer layer 105 may be achieved by sputter deposition. This sputter deposition can be controlled so that the density of this layer can be varied from 1 gram/cubic centimeter to 3 grams/cubic centimeter. The density is related in a known fashion to index of refraction and extinction coefficient. Generally, the higher density is better, but the higher density tends to cause diamond formation and accompanying unwanted stresses. A good choice is between 2 and 2.2 grams/cubic centimeter. In a process there may be small amounts of other material that may be either helpful or at least not harmful. Thus, buffer layer is preferably substantially amorphous carbon and may or may not have some other small amounts of other material.

Absorbing layer 107 may be of another absorbing composition. Some such compositions currently being considered are tantalum silicon nitride, tantalum silicon oxide, tantalum boron nitride, tantalum nitride, tantalum oxide. Similarly, other transparent compositions for transparent layer 103 may also be used. Fluorine-doped silicon oxide is one such example. Also other materials than amorphous carbon may also be useful as buffer layer 105. Desirable characteristics of buffer layer 105 are that it be effective as an ion absorber during repairing, removable after repair, and light absorbing at the frequency at which the mask is used to pattern photoresist on a semiconductor wafer.

Defect 117 would typically arise from a particle that was on the mask at the time of patterning absorbing layer 107. Under defect 117 is an unwanted portion 119 of absorbing layer 107 that remains because defect acts as an etch mask during the patterning of absorbing layer 107. In this example, unwanted portion arises from defect that operates as a mask, but an unwanted portion may arise from other causes. One such cause is a writing error. Defect 117 and unwanted portion 119 are found by inspecting the mask by using a commercially available inspection tool.

Figure 2:
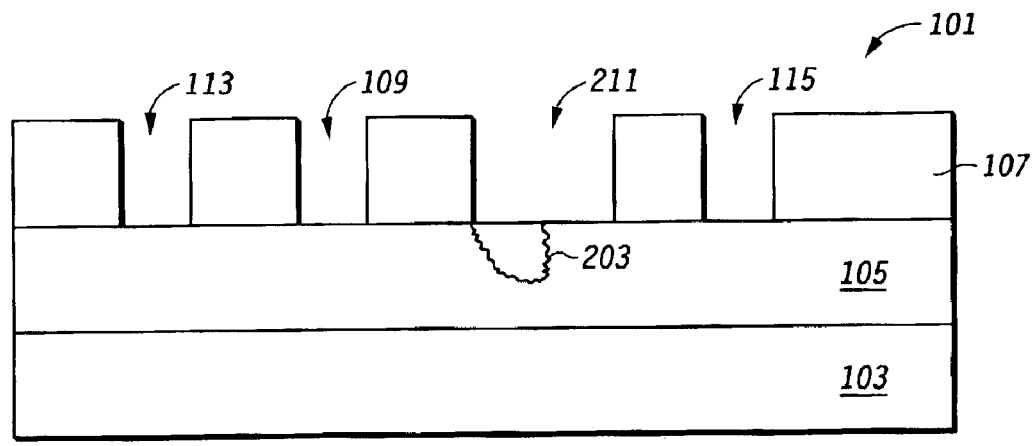
FIG. 2 is a cross section of the mask at a subsequent stage in processing.

Shown in FIG. 2 is mask 101 after a repair operation that removes defect 117 and unwanted portion 119. The result, however, of the typical repair process, which uses gallium ions in focused ion beam (FIB) process, is gallium ions penetrate past absorbing layer 107. In this case, these gallium ions are in a region 203 of buffer layer 105, in the location under unwanted portion 119, because of the implanting that inherently occurs in the FIB process. These implanted gallium ions provide insignificant absorption at the g-line wavelength, which is 436 nanometers. At some of the lower wavelengths, such as 248 nanometers, however, these gallium ions become absorbing. This absorbing characteristic gets stronger as the wavelengths are lowered from 248 nanometers. Thus, at the lower wavelengths, the presence of the gallium is effectively a defect that must be removed. For wavelengths of between 120 and 400 nanometers this is particularly important to remove gallium ions from the areas where light is intended to pass through mask 101.

Figure 3:
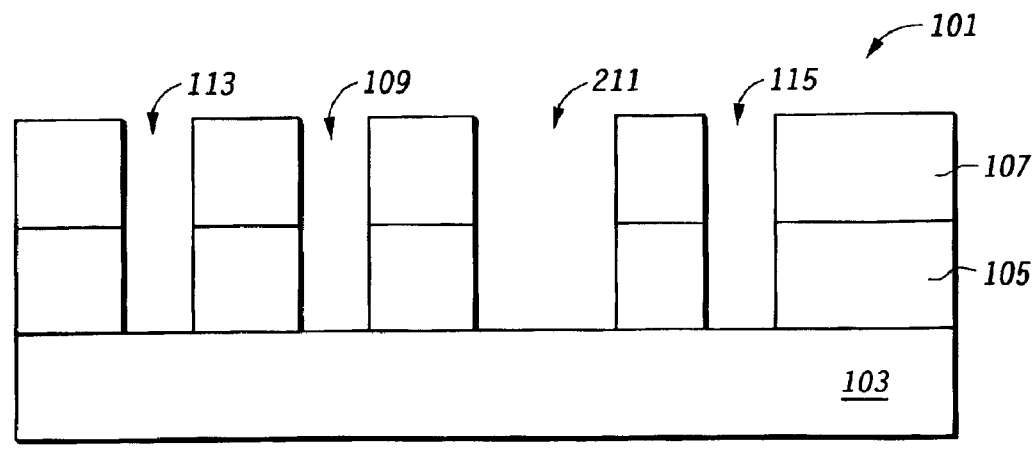
FIG. 3 is a cross section of the mask after completion.

Shown in FIG. 3 is mask 101 after region 203 has been removed. This is achieved by a chemistry that is effective in removing amorphous carbon, such as oxygen plasma. The pattern resident in absorbing layer 107 is used as a mask during the etching of buffer layer 105. Thus, buffer layer 105 is patterned the same as is absorbing layer 107. Buffer layer 105 is thus effective at absorbing the ions generated during the FIB process while also being able to be easily removed without altering the pattern in the absorbing layer. It may be that some gallium ions also reach areas under the remaining portion of absorbing layer 107. Gallium ions in those locations cause no harm because absorbing is desired in those areas anyway.

Figure 4:
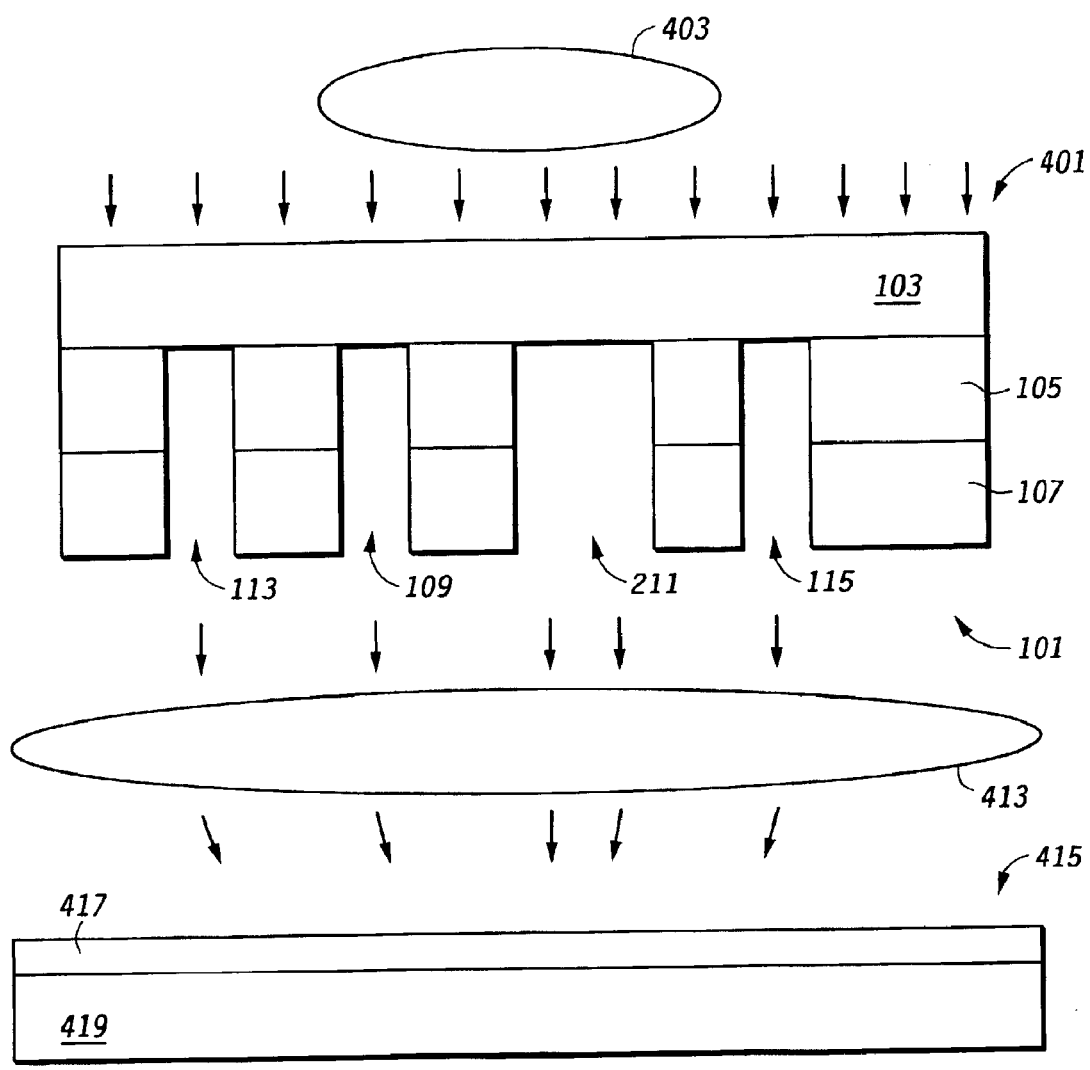
FIG. 4 is an apparatus for using the mask to pattern photoresist on a semiconductor wafer.

Shown in FIG. 4 is an arrangement 401 for using mask 101 to pattern photoresist 417 on a semiconductor wafer 419. An optical source 403 provides optical radiation (light) at the desired wavelength to mask 101 that blocks such light according to the desired pattern present in absorbing layer 107 and buffer layer 105. The patterned light that passes through mask 101 is then processed by optical system 413 and then received by photoresist 417. Optical system, as is typical, is preferably a reduction optical system that provides demagnification. Photoresist 417 is exposed according to the pattern present in mask 101. During this process, it is beneficial that buffer layer 105 be non-reflecting. The reflection should be 12% or less. This is best achieved by being absorbing. If buffer layer 105 were non-absorbing, reflections would occur at the interfaces. These reflections can cause unwanted interference with the light that is intended to pass through mask 101 as the pattern. This is undesirable and can cause incomplete exposure of the photoresist at the edges of the desired pattern. Perhaps these reflections could be cancelled, but the thickness of buffer layer 105 would have to be carefully selected and controlled.

In the foregoing specification, the invention has been described with reference to specific embodiments. However, one of ordinary skill in the art appreciates that various modifications and changes can be made without departing from the scope of the present invention as set forth in the claims below. For example, this process and structure may be useful for situations other than just repair. Modifications to a mask may be useful for experiments with differing transistor characteristics or differing line widths, for example. This mask structure, method of making a mask, and process for making a semiconductor may be useful for modifications that would enable such experiments. Also modifications may include adding portions to absorbing layer 107. When adding a portion, a problem arises because of overspray, which is implanting into areas adjacent to the areas where material is added. These adjacent areas thus may also include unwanted opaque material that is desirably removed. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An optical lithography mask comprising:
   a transparent substrate;
   a patterned absorbing layer;
   a buffer layer located between the transparent substrate and the patterned absorbing layer, the buffer layer having a pattern translated from the patterned absorbing layer.

2. The mask of claim 1 wherein the buffer layer is at least substantially hydrogen free.

3. The mask of claim 1 wherein the buffer layer is applied by sputtering.

4. The mask of claim 1 wherein the buffer layer includes a substrate side, wherein a percentage of reflection of the substrate side of the buffer layer is 12% or less at an optical wavelength used for patterning a photoresist layer on a semiconductor wafer with the mask.

5. The mask of claim 4 wherein the optical wavelength is in the range of 120 nanometers to 400 nanometers.

6. The mask of claim 1 wherein the absorbing layer includes chromium.

7. The mask of claim 1 further comprising a capping layer between the absorbing layer and the buffer layer.

8. The mask of claim 1 wherein the absorbing layer includes at least one of tantalum silicon nitride, tantalum silicon oxide, tantalum boron nitride, tantalum nitride, and tantalum oxide.

9. The mask of claim 1 wherein the buffer layer includes carbon.

10. The mask of claim 9 wherein the buffer layer is made of substantially carbon.

11. The mask of claim 9 wherein the buffer layer is made of substantially amorphous carbon.

12. The mask of claim 1 wherein the buffer includes a material having an ion absorption capacity and a thickness to provide a barrier for ions from entering the transparent substrate during a modification of the patterned absorbing layer.

13. A method for patterning photoresist on a wafer utilizing optical radiation, the method comprising:
    forming a mask including a transparent substrate, and absorbing layer, and a buffer layer located between the transparent substrate and the absorbing layer;
    etching an absorbing layer;
    etching the buffer layer after etching the absorbing layer;
    patterning a photoresist layer on a semiconductor wafer with the mask after the etching the buffer layer, the patterning including passing optical radiation through the transparent substrate of the mask.

14. The method of claim 13 further comprising:
    inspecting the absorbing layer of the mask after the etching the absorbing layer and before the etching the buffer layer.

15. The method of claim 14 further comprising:
    modifying the absorbing layer after the inspecting, the modifying including removing a portion of the absorbing layer utilizing a focused ion beam, the buffer layer having an ion absorption capacity and a thickness to provide a barrier for ions of the focused ion beam from entering the transparent substrate.

16. The method of claim 14 further comprising:
    modifying the absorbing layer after the inspecting to form a modified patterned absorbing layer having a pattern;
    wherein the etching the buffer layer includes translating the pattern into the buffer layer.

17. The method of claim 14 wherein the modifying includes removing portions of the absorbing layer after the inspecting.

18. The method of claim 14 wherein the modifying includes adding to the absorbing layer after the inspecting.

19. The method of claim 13 wherein the transparent substrate has a transparency parameter, wherein the transparency parameter remains unchanged during the etching of the absorbing layer.

20. The method of claim 13 wherein the buffer layer includes carbon.

21. The method of claim 20 wherein the buffer layer is made of substantially carbon.

22. The method of claim 20 wherein the buffer layer is made of substantially amorphous carbon.

23. The method of claim 13 wherein the forming the mask further includes sputter depositing the buffer layer over the transparent substrate.

24. The method of claim 13 wherein:
   the optical radiation has a wavelength;
   the buffer layer includes a substrate side;
   a percentage of reflection of the substrate side of the buffer layer is 12% or less at the wavelength.

25. The method of claim 24 wherein the wavelength is in the range of 120 nanometers to 400 nanometers.

26. The method of claim 13 wherein the forming the mask further includes forming a capping layer between buffer layer and the absorbing layer.

27. The method of claim 13 wherein the absorbing layer includes chromium.

28. The method of claim 13 wherein the absorbing layer includes at least one of tantalum silicon nitride, tantalum silicon oxide, tantalum boron nitride, tantalum nitride, and tantalum oxide.

29. A method for patterning photoresist on a wafer utilizing optical radiation, the method comprising:

sputtering a material including carbon over a transparent substrate to form a buffer layer;

forming an absorbing layer over the buffer layer;

etching the absorbing layer to form a patterned absorbing layer;

inspecting the patterned absorbing layer;

modifying the patterned absorbing layer to form a modified patterned absorbing layer having a pattern after the inspecting;

translating the pattern into the buffer layer;

patterning a photoresist layer on a semiconductor wafer with the mask after the translating, the patterning including passing optical radiation through the transparent substrate of the mask.

* * * * *